United States Patent [19]

Hammer et al.

[11] 4,100,313

[45] Jul. 11, 1978

[54] PROCESS FOR FORMING AN OPTICAL WAVEGUIDE

[75] Inventors: Jacob Meyer Hammer, Trenton, N.J.; Clyde Carl Neil, Levittown, Pa.

[73] Assignee: RCA Corporation, New York, N.Y.

[21] Appl. No.: 625,885

[22] Filed: Oct. 28, 1975

[51] Int. Cl.² .................... B05D 5/06; C23C 11/08
[52] U.S. Cl. .................... 427/162; 427/248 R; 427/282; 427/286; 350/96.30
[58] Field of Search .......... 427/166, 162, 167, 282, 427/286, 248 R, 248 A–248 J; 350/96 WG

[56] References Cited

U.S. PATENT DOCUMENTS

| | | | |
|---|---|---|---|
| 2,633,427 | 3/1953 | Dimmick et al. | 427/248 R |
| 3,226,255 | 12/1965 | Cieniewicz et al. | 427/282 X |
| 3,272,175 | 9/1966 | Lorenz et al. | 427/286 X |
| 3,374,111 | 3/1968 | Brennemann | 427/248 H |
| 3,510,349 | 5/1970 | Jones | 427/282 X |
| 3,799,792 | 3/1974 | Ryng | 427/282 X |
| 3,822,929 | 7/1974 | Heidrich et al. | 350/96 WG |
| 3,923,373 | 12/1975 | Dabby et al. | 350/96 WG |
| 3,930,065 | 12/1975 | Baker et al. | 357/24 X |
| 3,936,545 | 2/1976 | Brill et al. | 427/282 X |
| 3,967,365 | 7/1976 | Friedrich | 357/24 X |
| 4,037,005 | 7/1977 | Phillips | 427/162 |

FOREIGN PATENT DOCUMENTS

| | | | |
|---|---|---|---|
| 1,378,052 | 3/1963 | France | 427/91 |

OTHER PUBLICATIONS

*J. of Electronic Materials,* vol. 4, No. 3, Jun., 1975, pp. 549-565.

*Primary Examiner*—Harry J. Gwinnell
*Attorney, Agent, or Firm*—H. Christoffersen; Birgit E. Morris

[57] ABSTRACT

A technique for generating long narrow microstructures based upon the shadowing effect of thick slits placed between a source and a substrate. The method is particularly well suited for forming optical waveguides using a mask having a slit with a width larger than the width of the stripe to be deposited and being thick relative to the width of said slit.

4 Claims, 1 Drawing Figure

PROCESS FOR FORMING AN OPTICAL WAVEGUIDE

BACKGROUND OF THE INVENTION

The Government has rights in this invention pursuant to Contract No. N00014-75-C-0078 awarded by the Department of the Navy.

Conventional photo-lithographic techniques are of limited value in producing micro-structures, having transverse dimensions on the order of microns and longitudinal dimensions on the order of centimeters, because of differences in the resolution power of the photographic lens in perpendicular directions. Illustrative of such structures are stripe or channel guide modulators described by Taylor in J. Applied Physics, Vol. 44, pp. 3257 – 3262 (1973).

SUMMARY OF THE INVENTION

A masking slit is used to evaporate directly narrow structures having a transverse dimension on the order of one micron and a longitudinal dimension on the order of centimeters. The slits do not have to have extremely small dimensions to achieve this result. A shadowing effect is used to obtain the deposited pattern with the desired narrow widths by directing the evaporated material through the masking slit of a thick (relative to the slit width) mask at a small acute angle to the surface of the mask.

BRIEF DESCRIPTION OF THE DRAWING

The FIGURE is a schematic view of a thick shadowing slit arrangement for direct formation of patterns during evaporation.

DETAILED DESCRIPTION OF THE INVENTION

The sole FIGURE of the drawing schematically illustrates one embodiment of the production of a long narrow stripe on a substrate in accordance with the invention. The source, which may be niobium, or other suitable material, is located as shown in position 1. The source 1 is evaporated through a thin first mask 2 with a limiting aperture 3 to reduce some of the wide scattering of evaporated material. The evaporated molecules or atoms travel in straight lines, pass through a thick second mask 4, and deposit upon a substrate 5 on the far side 6 of the mask 4. The length of the slit (not shown) in the direction going into the paper, determines the longitudinal dimension of the deposited stripe structure. This dimension may be on the order of centimeters. The near edge 7 of the slit 8, on the side of the mask closest to the source, and the far edge 9 of the slit, on the side of the mask more remote from the source, limit the transverse dimensions, or width, of the deposited structure and produce a layer having a width on the order of microns. In such an arrangement, the wall 10 of the slit 8 intercepts evaporated material and this serves as part of the masking surface area. The slit 8 will shadow an evaporated stripe of width $w$ on the substrate as shown.

The distance $D_I$ should be such that the small acute angles formed by the perpendicular of the distance D to the surface of the thick mask 4 and the near edge 7 and far edge 9 respectively of the slit 8, permit straight line sight of the evaporated material to the substrate. Illustrative dimensions are for H, the distance between the source 1 and the thick mask 4, being about 20 cm; D, the distance $D_I$ or $D_{II}$, that is the distance, parallel to the surface of the mask and perpendicular to the slit width, between the source and the centerline of the thick mask 4, being about 2 cm; and both $t$, the thickness of the thick mask 4, and $s$, the width of the slit 5 being each about 0.01 cm.

If a stripe is formed with the source at position 1 and then the source is displaced to position II and if $D_{II}$ is equal to $D_I$ then a second stripe can be deposited running parallel to the first stripe and separated from it by a small distance. If $D_I$ is not equal to $D_{II}$, the second stripe will have a width other than that of the first stripe. Thus, with a simple parallel slit, two parallel stripes, with chosen widths less than the slit width and a gap between them, can be obtained.

The approach hereof is particularly well suited to form a $LiNb_xTa_{1-x}O_3$ stripe optical waveguide since the niobium can be deposited in the desired pattern on lithium tantalate using the slits, and only a subsequent diffusion step is required to produce a stripe optical waveguide.

EXAMPLE

Two niobium stripes each of width 5 μm and separated by a gap, or near edge distance, of 2 μm deposited on a lithium tantalate substrate may be used to construct a $LiNb_xTa_{1-x}O_3$ stripe guide modulator. These stripes have to be parallel for 0.4 cm. A mask with a thickness $t$ equal to 5 mils or 127 μm and a slit width $s$ equal to 0.5 mil or 12.7 μm is used to achieve this result. The slit length perpendicular to the plane of the FIGURE of the drawing is 0.4 cm. If $D_I = 1.2$ cm, $H = 25$ cm and $h$ equals 0, that is if the substrate is in direct contact with the slit, the desired 5 μm stripes spaced 2 μm apart will be obtained. The dimension of the stripe width and spacing can be varied by varying the dimensions $D_I$ and $D_{II}$, H, $t$ and $h$. If desired, the source can be on the top and the substrate below the thick mask.

If desired, for the stripe guide directional coupler to have entry horns, or a curved section, the slits should have a straight section followed sequentially by a corresponding curved section. Optical waveguides can also be prepared by depositing other materials, e.g., a transition metal such as titanium, vanadium, chromium, manganese, iron, nickel or cobalt onto a lithium niobate substrate and then in-diffusing the deposited material.

Other patterns with relatively small dimensions in one direction and relatively large dimensions in the direction perpendicular to the small dimensions, can also be fabricated using suitable slits. For instance, long thin parallel electrodes, for example 2 cm long by 4 μm wide can be prepared by evaporation, onto a substrate, employing a masking technique hereof, for example, a 100Å thick chromium layer followed by a 1000Å thick gold layer or a narrow electrode comprising a 50Å thick titanium flash followed by a 500Å thick aluminum layer.

What is claimed is:

1. A process for forming an optical waveguide which comprises:
   (a) positioning an evaporator source for material to be deposited and a substrate upon which material is to be deposited on opposite sides of a mask wherein
      (i) said material is selected from the group consisting of niobium, titanium, vanadium, chromium, manganese, iron, nickel and cobalt;
      (ii) said substrate is selected from the group consisting of lithium tantalate and lithium niobate, (iii) said mask has a slit with a width larger than the width of the stripe to be deposited and being thick relative to the width of said slit, and (iv) said evaporator source is at a small acute angle relative to said slit whereby a shadowing effect reduces the effective width of said slit;

(b) evaporatively depositing material through said slit to produce a stripe of desired width; and (c) diffusing the deposited material into the substrate whereby an optical waveguide is formed.

2. The process of claim 1, wherein the substrate and said mask are in direct contact.

3. The process of claim 1, wherein the width of the slit is on the order of tens of microns and the width of the long thin stripe is on the order of microns.

4. The process of claim 1, wherein two long thin stripes are deposited parallel to each other.

* * * * *